(12) United States Patent
Jeong et al.

(10) Patent No.: US 11,183,596 B2
(45) Date of Patent: Nov. 23, 2021

(54) THIN FILM TRANSISTOR AND METHOD FOR FABRICATING SAME

(71) Applicant: IUCF-HYU (INDUSTRY-UNIVERSITY COOPERATION FOUNDATION HANYANG UNIVERSITY), Seoul (KR)

(72) Inventors: Jae Kyeong Jeong, Seoul (KR); Taikyu Kim, Seoul (KR); Baekeun Yoo, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 16/675,945

(22) Filed: Nov. 6, 2019

(65) Prior Publication Data
US 2020/0220025 A1 Jul. 9, 2020

(30) Foreign Application Priority Data
Jan. 7, 2019 (KR) .................. 10-2019-0001522

(51) Int. Cl.
*H01L 29/786* (2006.01)
*H01L 29/66* (2006.01)
(Continued)

(52) U.S. Cl.
CPC .... *H01L 29/78684* (2013.01); *H01L 21/0256* (2013.01); *H01L 21/02172* (2013.01); *H01L 21/02535* (2013.01); *H01L 21/02568* (2013.01); *H01L 21/28194* (2013.01); *H01L 21/324* (2013.01); *H01L 21/477* (2013.01); *H01L 29/161* (2013.01); *H01L 29/24* (2013.01);
(Continued)

(58) Field of Classification Search
CPC ........ H01L 29/78684; H01L 29/78693; H01L 29/66742; H01L 29/161; H01L 29/78696; H01L 29/7869; H01L 29/66969; H01L 29/247; H01L 29/24; H01L 21/477; H01L 29/78618; H01L 29/78672; H01L 21/02568; H01L 21/02535; H01L 21/02172; H01L 21/0256; H01L 21/324; H01L 21/28194
See application file for complete search history.

(56) References Cited

U.S. PATENT DOCUMENTS 7,026,713 B2 4/2006 Hoffman et al.
8,598,577 B2 12/2013 Park et al.
(Continued)

FOREIGN PATENT DOCUMENTS

JP 2010-189227 A 9/2010
JP 5168605 B2 3/2013
(Continued)

*Primary Examiner* — Ahmed N Sefer
(74) *Attorney, Agent, or Firm* — Sughrue Mion, PLLC

(57) ABSTRACT

Provided is a thin film transistor including a source electrode, a drain electrode, and a channel layer connecting the source electrode and the drain electrode. The channel layer includes a tin-based oxide represented by SnMO, wherein M includes at least one of a non-metal chalcogen element or a halogen element.

16 Claims, 6 Drawing Sheets

(51) Int. Cl.
  *H01L 29/161*  (2006.01)
  *H01L 29/24*  (2006.01)
  *H01L 21/477*  (2006.01)
  *H01L 21/02*  (2006.01)
  *H01L 21/28*  (2006.01)
  *H01L 21/324*  (2006.01)

(52) U.S. Cl.
  CPC ...... *H01L 29/247* (2013.01); *H01L 29/66742* (2013.01); *H01L 29/66969* (2013.01); *H01L 29/7869* (2013.01); *H01L 29/78618* (2013.01); *H01L 29/78672* (2013.01); *H01L 29/78693* (2013.01); *H01L 29/78696* (2013.01)

(56) References Cited

U.S. PATENT DOCUMENTS

| | | | |
|---|---|---|---|
| 9,647,135 | B2 | 5/2017 | Nomura |
| 9,685,542 | B2 | 6/2017 | Nomura et al. |
| 10,388,538 | B2 | 8/2019 | Yamazaki et al. |
| 2010/0051934 | A1* | 3/2010 | Choung ............... H01L 27/124 257/43 |
| 2011/0215325 | A1 | 9/2011 | Yamazaki et al. |
| 2011/0309356 | A1* | 12/2011 | Yabuta ............... H01L 29/7869 257/43 |
| 2013/0292668 | A1* | 11/2013 | Oh ................... H01L 21/02628 257/43 |
| 2014/0145179 | A1* | 5/2014 | Yoon ................ H01L 29/78621 257/43 |
| 2014/0159035 | A1* | 6/2014 | Park ................... H01L 29/7869 257/43 |
| 2014/0273340 | A1* | 9/2014 | Van Duren ......... H01L 29/7869 438/104 |
| 2015/0076487 | A1* | 3/2015 | Shimoda ........... H01L 29/66969 257/43 |
| 2015/0140699 | A1* | 5/2015 | Kim .................. H01L 21/02488 438/23 |
| 2015/0280000 | A1* | 10/2015 | Seon ................. H01L 29/78696 257/43 |
| 2016/0218223 | A1* | 7/2016 | Nomura ............ H01L 21/02565 |
| 2016/0284853 | A1* | 9/2016 | Pham ................ H01L 27/1225 |
| 2018/0190683 | A1* | 7/2018 | Koo ................. H01L 27/1229 |
| 2019/0305138 | A1* | 10/2019 | Sharma ............. H01L 29/66757 |
| 2020/0006388 | A1* | 1/2020 | Dewey ............... H01L 27/0688 |
| 2020/0388685 | A1* | 12/2020 | Sharma ................ H01L 29/26 |

FOREIGN PATENT DOCUMENTS

| | | |
|---|---|---|
| KR | 10-1007618 B1 | 1/2011 |
| KR | 10-2011-0038966 A | 4/2011 |
| KR | 10-2012-0009993 A | 2/2012 |
| KR | 10-1120151 B1 | 3/2012 |
| KR | 10-2013-0007595 A | 1/2013 |
| KR | 10-2013-0008037 A | 1/2013 |
| KR | 10-1760212 B1 | 7/2017 |
| KR | 10-2017-0089110 A1 | 8/2017 |
| WO | 2010/010802 A1 | 1/2010 |

* cited by examiner

THIN FILM TRANSISTOR AND METHOD FOR FABRICATING SAME

CROSS-REFERENCE TO RELATED APPLICATIONS

This U.S. non-provisional patent application claims priority under 35 U.S.C. § 119 of Korean Patent Application No. 10-2019-0001522, filed on Jan. 7, 2019, the entire contents of which are hereby incorporated by reference.

BACKGROUND

The present disclosure herein relates to a thin film transistor and a method for fabricating the same, and more particularly, to a thin film transistor using a P-type oxide semiconductor thin film as a channel layer and a method for fabricating the same.

Recently, technology for integrating a thin film transistor with a logic circuit onto a transparent glass, a plastic substrate, or a semiconductor substrate has been studied. To fabricate the thin film transistor into a complementary metal-oxide semiconductor (CMOS) type, a P-type oxide thin film transistor in which a carrier is a hole is required together with an N-type oxide thin film transistor in which a carrier is an electron. The N-type oxide thin film transistor may use an N-type oxide semiconductor as a channel layer, and for example, an amorphous indium-gallium-zinc oxide (IGZO) having excellent electrical and optical characteristics, and the like may be used as a channel layer of the N-type oxide thin film transistor. A P-type oxide semiconductor used as a channel layer of the P-type oxide thin film transistor may have a large hole effective mass and poor carrier transport characteristics, whereby performances of the P-type oxide thin film transistor may be limited. Accordingly, various studies on a P-type oxide semiconductor thin film, which may achieve a P-type oxide thin film transistor having high-performances, have been conducted.

SUMMARY

The present disclosure provides a thin film transistor having improved electrical performances by reducing a hole effective mass of a P-type oxide semiconductor and a method for fabricating the same.

The present disclosure also provides a thin film transistor having improved surface roughness of a channel layer and a method for fabricating the same.

An embodiment of the inventive concept provides a thin film transistor including: a source electrode; a drain electrode; and a channel layer connecting the source electrode and the drain electrode. The channel layer may include a tin-based oxide represented by SnMO, wherein M may contain or include at least one of a non-metal chalcogen element or a halogen element.

In an embodiment, M may include at least one of selenium (Se), sulfur (S), fluorine (F), chlorine (Cl), bromine (Br), or iodine (I).

In an embodiment, the channel layer may include a tin-based oxide represented by $SnM_xO_{1-x}$, where x may be larger than 0.2 and smaller than 0.8.

In an embodiment, the channel layer may include a tin-based oxide represented by $SnM_xO_{1-x}$, where x may be larger than 0.4 and smaller than 0.7.

In an embodiment, the tin-based oxide may include an amorphous phase.

In an embodiment, the channel layer may further include a metal element for adjusting a band gap energy of the tin-based oxide.

In an embodiment, the metal element may include at least one of lanthanum (La), calcium (Ca), strontium (Sr), yttrium (Y), tantalum (Ta), hafnium (Hf), titanium (Ti), barium (Ba), or zirconium (Zr).

In an embodiment, the channel layer may further include a P-type impurity.

In an embodiment, the P-type impurity may include at least one of nitrogen (N), phosphorus (P), or arsenic (As).

In an embodiment, the thin film transistor further includes: a gate electrode; and a gate dielectric layer between the channel layer and the gate electrode.

In an embodiment of the inventive concept, a thin film transistor includes: a source electrode; a drain electrode; and a P-type oxide semiconductor layer connecting the source electrode and the drain electrode. The P-type oxide semiconductor layer may include SnMO, wherein M may contain or include at least one of a non-metal chalcogen element or a halogen element.

In an embodiment, at least a portion of the P-type oxide semiconductor layer may be amorphous.

In an embodiment, the P-type oxide semiconductor layer may include SnSeO which includes an amorphous phase.

In an embodiment, the P-type oxide semiconductor layer may include $SnSe_xO_{1-x}$, where x may be larger than 0.2 and smaller than 0.8.

In an embodiment, the P-type oxide semiconductor layer may include $SnSe_xO_{1-x}$, where x may be larger than 0.4 and smaller than 0.7.

In an embodiment, the P-type oxide semiconductor layer may further include a metal element.

In an embodiment, the P-type oxide semiconductor layer may further include a P-type impurity.

In an embodiment, the thin film transistor further includes: a gate electrode; and a gate dielectric layer between the P-type oxide semiconductor layer and the gate electrode.

In an embodiment of the inventive concept, a method for fabricating a thin film transistor includes: forming an oxide semiconductor layer on a substrate; and heat-treating the oxide semiconductor layer. The oxide semiconductor layer may include SnMO, wherein M may contain or include at least one of a non-metal chalcogen element or a halogen element.

In an embodiment, the forming an oxide semiconductor layer may include: performing a sputtering process by using an Sn target and an SnM target; supplying an oxygen gas during the sputtering process; and adjusting an amount of M in the oxide semiconductor layer by adjusting power applied to the SnM target.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
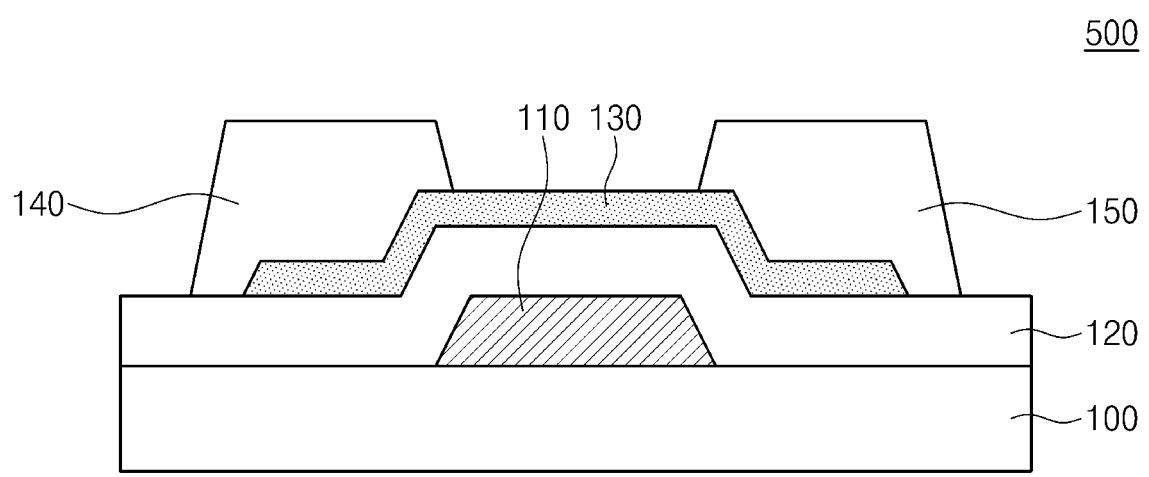
FIG. 1 is a cross-sectional view of a thin film transistor according to some embodiments of the inventive concept.

Preferred embodiments of the inventive concept will be described with reference to the accompanying drawings so as to sufficiently understand constitutions and effects of embodiments of the inventive concept. The present disclosure may, however, be embodied in different forms with various changes and should not be construed as limited to the embodiments set forth herein. Rather, these embodiments are provided so that this disclosure will be thorough and complete, and will fully convey the scope of the present disclosure to those skilled in the art.

In the specification, it will be understood that when one element is referred to as being 'on' another element, it can be directly on the other element, or intervening elements may also be present. In the figures, moreover, the dimensions of elements are exaggerated for clarity of illustration Like reference numerals refer to like elements throughout.

The embodiments in the detailed description will be described with sectional and/or plane views as ideal exemplary views of the present invention. In the figures, the dimensions of layers and regions are exaggerated for clarity of illustration. Areas exemplified in the drawings have general properties, and are used to illustrate a specific shape of a semiconductor package region. Thus, this should not be construed as limited to the scope of the present invention.

It will be understood that although the terms first, second, and third are used herein to describe various elements, these elements should not be limited by these terms. These terms are used only to discriminate one region or layer from another region or layer. An embodiment described and exemplified herein includes a complementary embodiment thereof.

In this specification, the terms are used only for explaining embodiments while not limiting the present disclosure. In this specification, the singular forms are intended to include the plural forms as well, unless the context clearly indicates otherwise. It will be understood that the terms 'comprises' and/or 'comprising', when used in this specification, specify the presence of stated components, steps, operations and/or elements, but do not exclude the presence or addition of one or more other components, steps, operations and/or elements.

Hereinafter, the inventive concept will be described in more detail with reference to the accompanying drawings.

Figure 2:
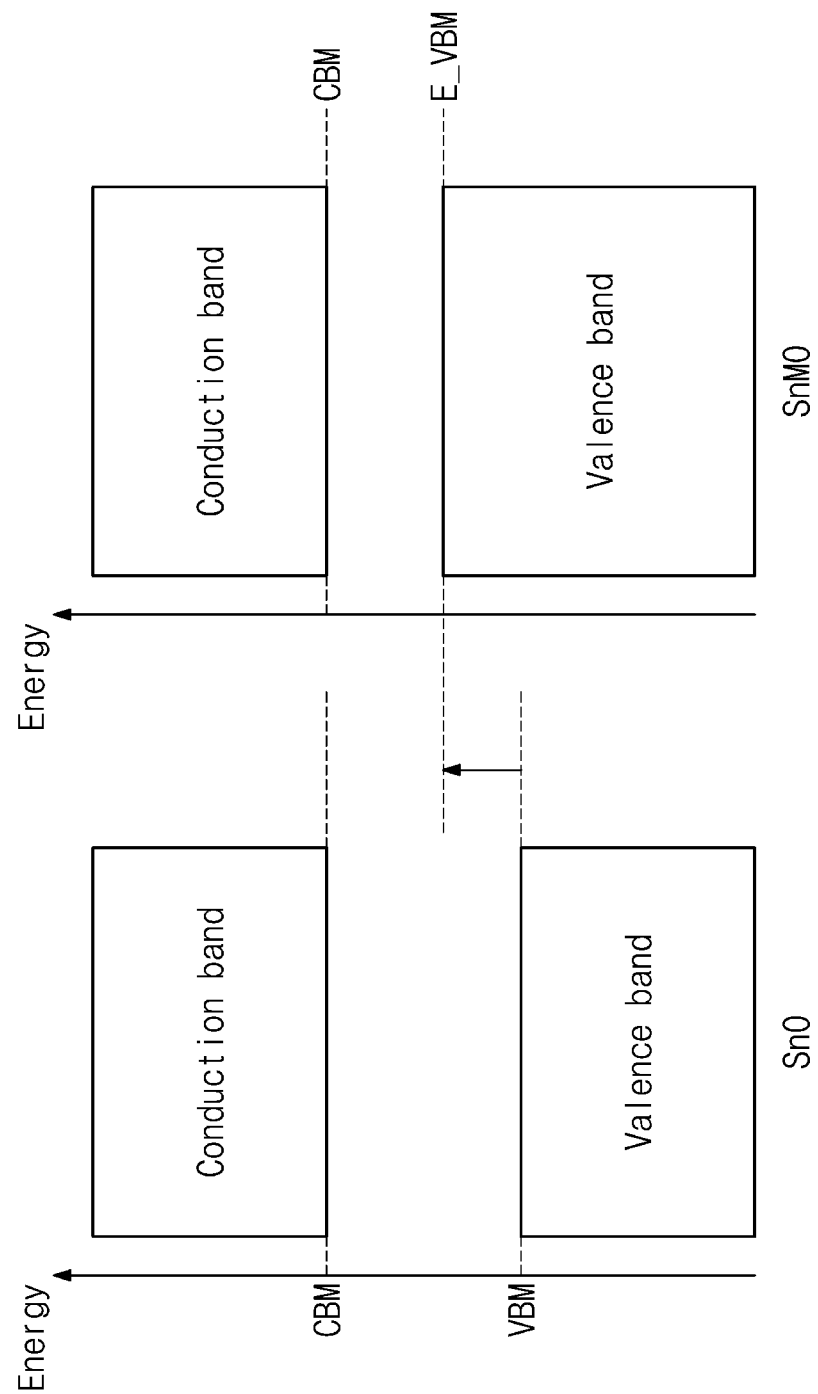
FIG. 2 is a conceptual diagram showing an energy band of an oxide semiconductor used as a channel layer in FIG. 1.

FIG. 1 is a cross-sectional view of a thin film transistor according to some embodiments of the inventive concept and illustrates a bottom gate type thin film transistor. FIG. 2 is a conceptual diagram showing an energy band of an oxide semiconductor used as a channel layer in FIG. 1.

Referring to FIG. 1, a thin film transistor 500 may include a gate electrode 110 on a substrate 100, a channel layer 130 on the gate electrode 110, a gate dielectric layer 120 between the gate electrode 110 and the channel layer 130, and a source electrode 140 and a drain electrode 150 which are connected to the channel layer 130. The source electrode 140 and the drain electrode 150 may be horizontally spaced apart from each other and the channel layer 130 may connect the source electrode 140 and the drain electrode 150 to each other. The gate electrode 110 may be spaced apart from the channel layer 130 by the gate dielectric layer 120.

The substrate 100 may be any one of a glass, metal foil, plastic, or silicone, but the embodiment is not limited thereto. The gate electrode 110 may include at least one of: a transparent metal formed of any one or a combination of two or more selected from the group consisting of an indium tin oxide (ITO), a gallium zinc oxide (GZO), an indium gallium zinc oxide (IGZO), an indium gallium oxide (IGO), an indium zinc oxide (IZO), and an indium oxide ($In_2O_3$); or a conductive metal such as tungsten, aluminum, and copper. The gate dielectric layer 120 may include at least one of an aluminum oxide, a silicon nitride, or a silicon oxide. Each of the source electrode 140 and the drain electrode 150 may include: a transparent metal formed of one or a combination of two or more selected from the group consisting of an indium tin oxide (ITO), a gallium zinc oxide (GZO), an indium gallium zinc oxide (IGZO), an indium gallium oxide (IGO), an indium zinc oxide (IZO), and an indium oxide ($In_2O_3$); and/or a conductive metal such as nickel, gold, and platinum.

The channel layer 130 may be a P-type oxide semiconductor layer.

The channel layer 130 may include a tin-based oxide represented by SnMO, wherein M may contain or include at least one of a non-metal chalcogen element or a halogen element. For example, M may contain or include at least one of selenium (Se), sulfur (S), fluorine (F), chlorine (Cl), bromine (Br), or iodine (I). The tin-based oxide may include an amorphous phase. Accordingly, at least a portion of the channel layer 130 may be amorphous, thereby reducing surface roughness of the channel layer 130.

Referring to FIGS. 1 and 2, the tin-based oxide of SnMO may have a more extended valence band than a tin oxide (SnO). That is, a valence band max (E_VBM) of the tin-based oxide of SnMO may be a higher energy level than a valence band max (VBM) of a tin oxide (SnO). This may be caused by hybridization of a s-orbital of Sn and p-orbitals of M and O in the valence band of the tin-based oxide of SnMO. As the tin-based oxide of SnMO has an extended valence band, a hole effective mass may be reduced despite structural disorder of the tin-based oxide of SnMO. As a result, hole mobility ($m_{hall}$) and hole carrier density ($n_h$) in the channel layer 130 may be increased, thereby improving electrical performances of the thin film transistor 500.

Referring to FIG. 1 again, the channel layer 130 may include a tin-based oxide represented by $SnM_xO_{1-x}$, where x may be larger than 0.2 and smaller than 0.8 (i.e., 0.2<x<0.8). In one example, the channel layer 130 includes a tin-based oxide of $SnSe_xO_{1-x}$, where x can be greater than 0.2 and smaller than 0.8. Table 1 shows surface roughness, hole mobility ($m_{hall}$), and hole carrier density ($n_h$) of the channel layer 130 depending on a selenium (Se) content (x) in the tin-based oxide.

TABLE 1

|  | SnO | SnSe$_{0.22}$O$_{0.78}$ | SnSe$_{0.56}$O$_{0.44}$ | SnSe$_{0.74}$O$_{0.26}$ |
| --- | --- | --- | --- | --- |
| surface roughness [nm] | 36.4 | 32.2 | 15.6 | 0.6 |
| n$_h$ [cm$^{-3}$] | — | 5.6 × 10$^{16}$ | 1.2 × 10$^{17}$ | 4.7 × 10$^{16}$ |
| m$_{hall}$ [cm$^2$V$^{-1}$S$^{-1}$] | — | 6.2 ± 2 | 15.0 ± 4 | 13.3 ± 2 |

As the selenium (Se) content (x) in the tin-based oxide is increased, the surface roughness of the channel layer 130 may be decreased. When a ratio of the selenium (Se) element and the oxygen element in the tin-based oxide is close to about 1:1 (e.g., SnSe$_{0.56}$O$_{0.44}$), the hole mobility (m$_{hall}$) and the hole carrier density (n$_h$) in the channel layer 130 may be maximum. When the selenium (Se) content (x) in the tin-based oxide is smaller than 0.2 (i.e., x<0.2), the tin-based oxide may be similar to a tin oxide (SnO) having a tetragonal crystal structure, thereby increasing the surface roughness of the channel layer 130. When the selenium (Se) content (x) in the tin-based oxide is larger than 0.8 (i.e., x>0.8), the tin-based oxide may be similar to tin selenide (SnSe) having an orthorhombic crystal structure. In this case, the surface roughness of the channel layer 130 may be decreased, but the thin film transistor 500 may not exhibit required electrical characteristics (e.g., transfer or output characteristics).

When the selenium (Se) content (x) in the tin-based oxide is larger than 0.2 and smaller than 0.8 (i.e., 0.2<x<0.8), the tin-based oxide may include an amorphous phase, thereby decreasing the surface roughness of the channel layer 130. In addition, in this case, as the tin-based oxide has an extended valence band as described with reference to FIG. 2, the hole effective mass may be decreased, and as a result, the hole mobility (m$_{hall}$) and the hole carrier density (n$_h$) in the channel layer 130 may be increased. Accordingly, the electrical performances of the thin film transistor 500 may be improved while reducing the surface roughness of the channel layer 130.

According to some embodiments, the channel layer 130 may include a tin-based oxide represented by SnM$_x$O$_{1-x}$, where x may be larger than 0.4 and smaller than 0.7 (i.e., 0.4<x<0.7). For example, the channel layer 130 may include a tin-based oxide of SnSe$_x$O$_{1-x}$, where x may be larger than 0.4 and smaller than 0.7. Table 2 shows hole mobility (m$_{hall}$) and hole carrier density (n$_h$) in the channel layer 130 depending on a selenium (Se) content (x) in the tin-based oxide.

TABLE 2

|  | SnSe$_{0.46}$O$_{0.54}$ | SnSe$_{0.52}$O$_{0.48}$ | SnSe$_{0.56}$O$_{0.44}$ | SnSe$_{0.62}$O$_{0.38}$ |
| --- | --- | --- | --- | --- |
| n$_h$ [cm$^{-3}$] | 9.8 × 10$^{16}$ | 9.1 × 10$^{16}$ | 1.2 × 10$^{17}$ | 8.0 × 10$^{16}$ |
| m$_{hall}$ [cm$^2$V$^{-1}$S$^{-1}$] | 9.3 ± 2 | 10.8 ± 3 | 15.0 ± 4 | 10.3 ± 3 |

When the selenium (Se) content (x) in the tin-based oxide is larger than 0.4 and smaller than 0.7 (i.e., 0.4<x<0.7), the hole mobility (m$_{hall}$) and the hole carrier density (n$_h$) in the channel layer 130 may be remarkably increased, whereby improvement of the electrical performances of the thin film transistor 500 may be easily achieved.

According to some embodiments, the channel layer 130 may further include a metal element for adjusting a band gap energy of the tin-based oxide. In an oxide semiconductor, transparency may increase as the band gap energy increases. When a content of the metal element in the channel layer 130 is increased, the band gap energy of the tin-based oxide may increase, and accordingly, the transparency of the channel layer 130 may increase. The metal element may be used to increase the transparency of the channel layer 130. The metal element, for example, may include at least one of lanthanum (La), calcium (Ca), strontium (Sr), yttrium (Y), tantalum (Ta), hafnium (Hf), titanium (Ti), barium (Ba), or zirconium. (Zr).

According to some embodiments, the channel layer 130 may further include a P-type impurity. The P-type impurity may be used to increase the P-type characteristics of the channel layer 130. The P-type impurity, for example, may include at least one of nitrogen (N), phosphorus (P), or arsenic (As).

Figure 3:
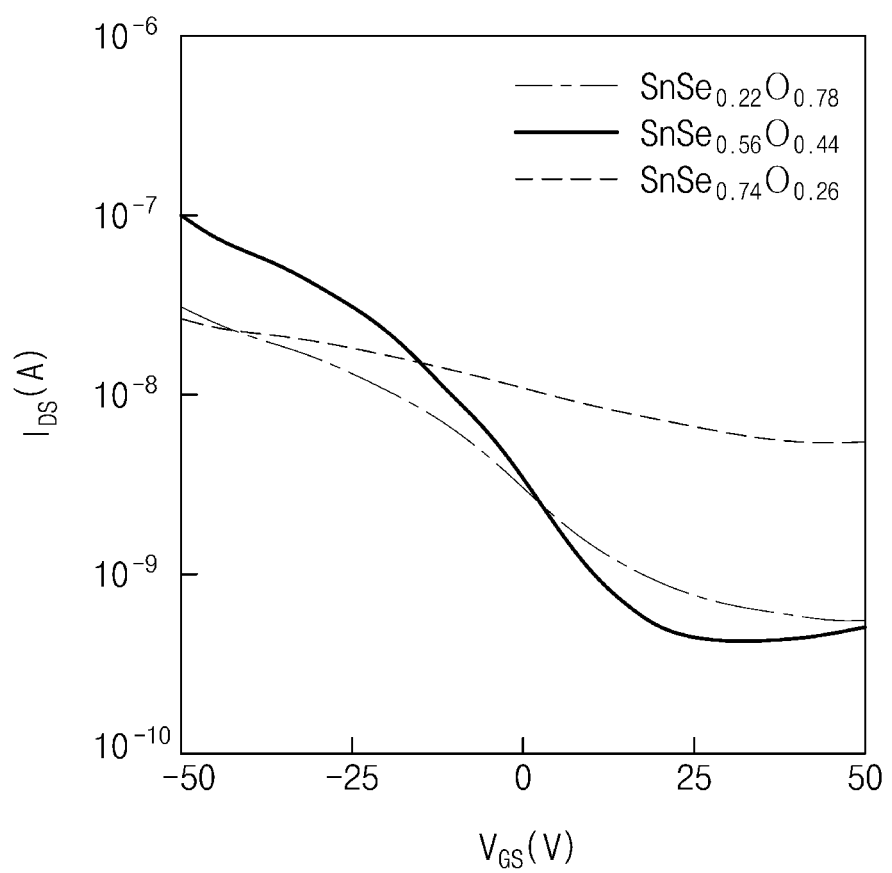
FIGS. 3 and 4 are graphs showing transfer characteristics of a thin film transistor according to some embodiments of the inventive concept.
Figure 4:
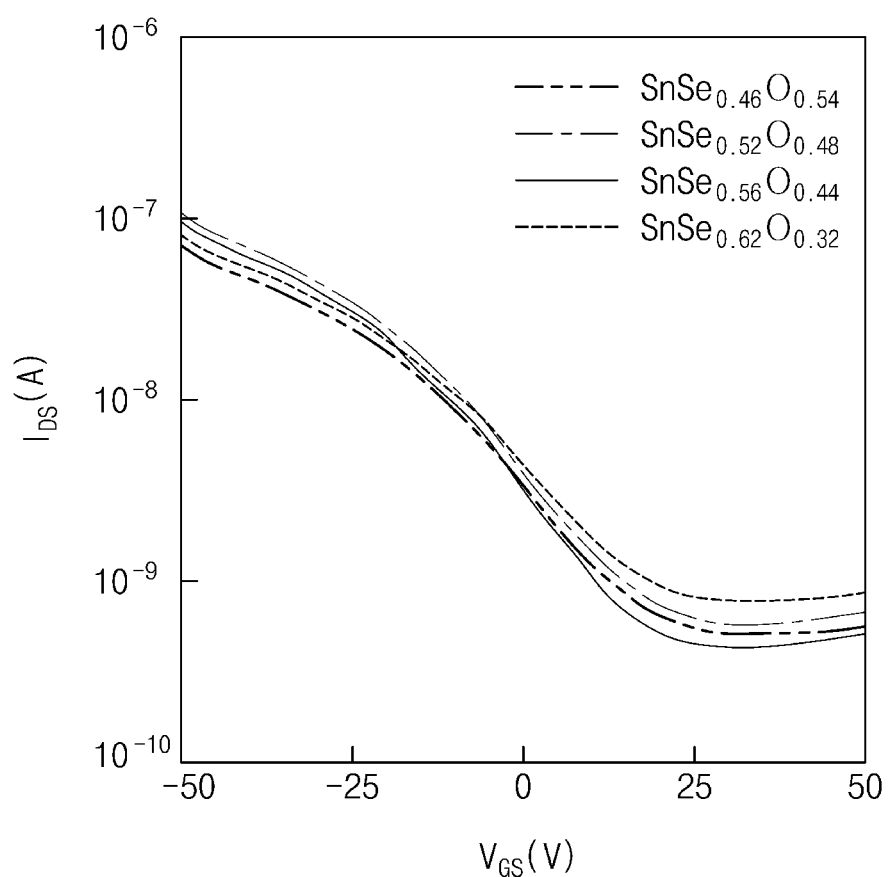
Figure 5:
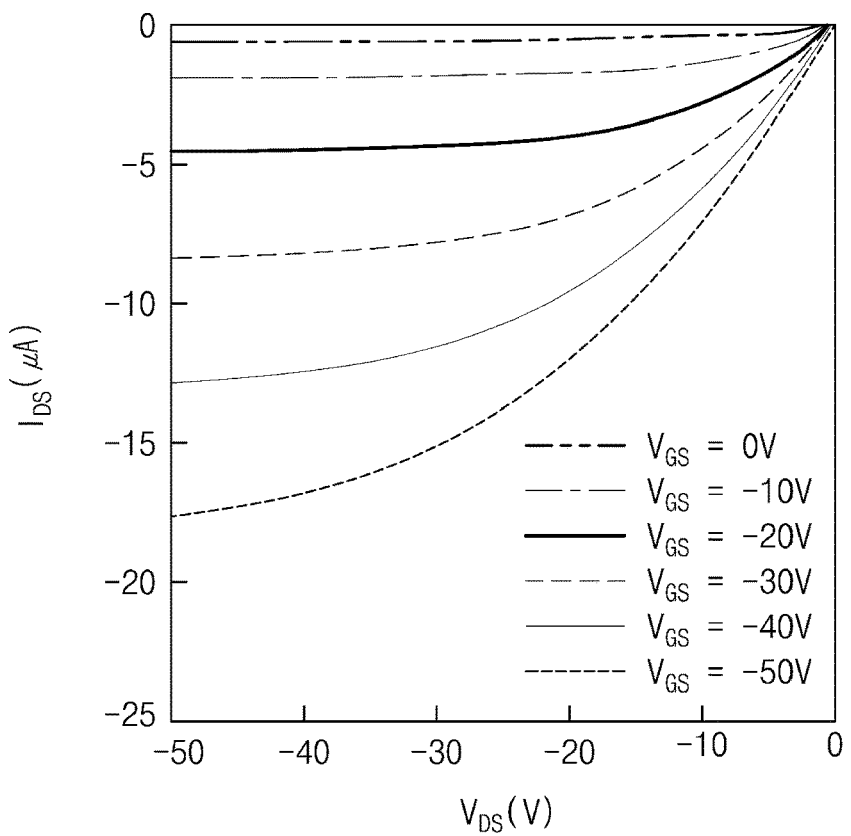
FIG. 5 is a graph showing output characteristics of a thin film transistor according to some embodiments of the inventive concept.

FIGS. 3 and 4 are graphs showing transfer characteristics of a thin film transistor according to some embodiments of the inventive concept and FIG. 5 is a graph showing output characteristics of a thin film transistor according to some embodiments of the inventive concept.

FIG. 3 shows the transfer characteristics when the channel layer 130 in the thin film transistor 500 includes a tin-based oxide of SnSe$_x$O$_{1-x}$, (where 0.2<x<0.8) and FIG. 4 shows the transfer characteristics when the channel layer 130 in the thin film transistor 500 includes a tin-based oxide of SnSe$_x$O$_{1-x}$, (where 0.4<x<0.7). Referring to FIGS. 3 and 4, it may be confirmed that when V$_{GS}$ is increased toward a negative voltage, the thin film transistor 500 is turned on and I$_{DS}$ is increased. That is, it may be confirmed that the thin film transistor 500 operates as a P-type oxide thin film transistor. Referring to FIG. 4 particularly, it may be confirmed that when the channel layer 130 in the thin film transistor 500 includes a tin-based oxide of SnSe$_x$O$_{1-x}$, (where 0.4<x<0.7), the transfer characteristics of the thin film transistor 500 are remarkably improved.

FIG. 5 shows output characteristics when the channel layer 130 in the thin film transistor 500 includes a tin-based oxide of SnSe$_{0.56}$O$_{0.44}$. Referring to FIG. 5, it may be confirmed that the I$_{DS}$ changes depending on a change of V$_{GS}$. It may be confirmed that the thin film transistor 500 may serve as a P-type oxide thin film transistor as I$_{DS}$ is controlled by V$_{GS}$.

Figure 6:
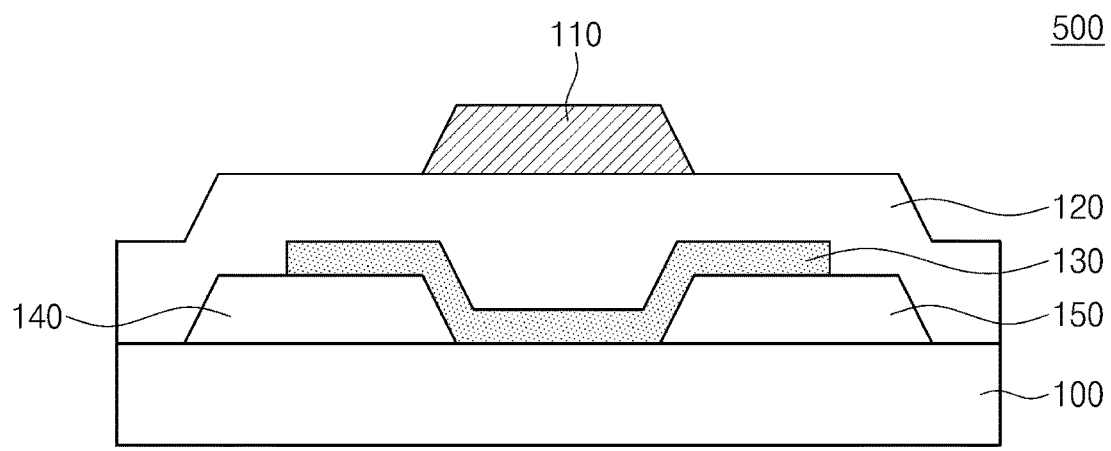
FIG. 6 is a cross-sectional view of a thin film transistor according to some embodiments of the inventive concept.

FIG. 6 is a cross-sectional view of a thin film transistor according to some embodiments of the inventive concept and illustrates a top gate type thin film transistor.

Referring to FIG. 6, the thin film transistor 500 may include: a channel layer 130 on a substrate 100; a gate electrode 110 on the channel layer 130; a gate dielectric layer 120 between the gate electrode 110 and the channel layer 130; and a source electrode 140 and a drain electrode 150 connected to the channel layer 130. The source electrode 140 and the drain electrode 150 may be horizontally spaced apart from each other and the channel layer 130 may connect the source electrode 140 and the drain electrode 150 to each other. The gate dielectric layer 120 may cover the channel layer 130, the source electrode 140, and the drain electrode 150. The gate electrode 110 may be spaced apart from the channel layer 130 by the gate dielectric layer 120. Except for the described structural difference, the thin film transistor 500 may be substantially the same as the thin film transistor 500 described with reference to FIGS. 1 and 2.

Figure 7:
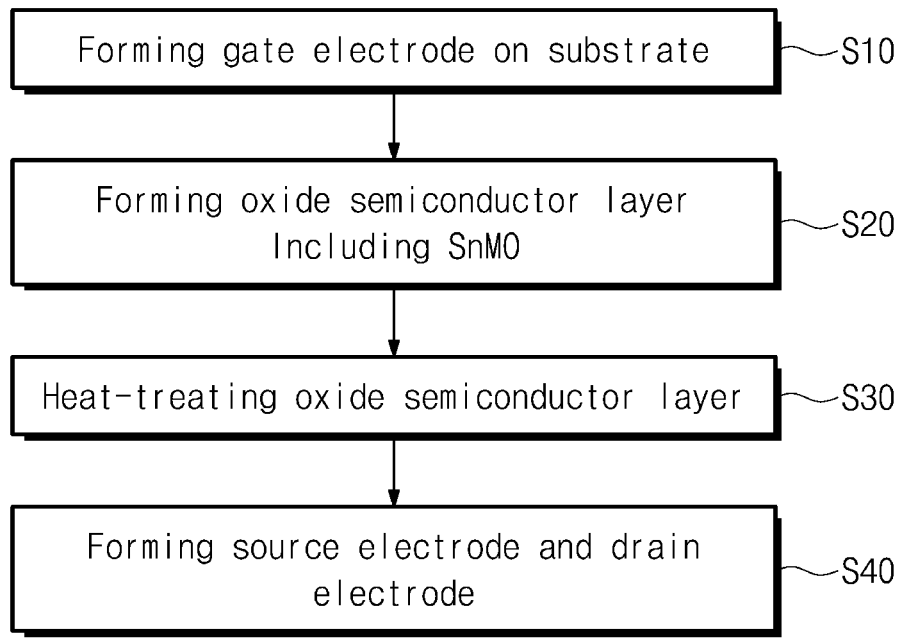
FIG. 7 is a flowchart illustrating a method for fabricating a thin film transistor according to some embodiments of the inventive concept.
Figure 8:
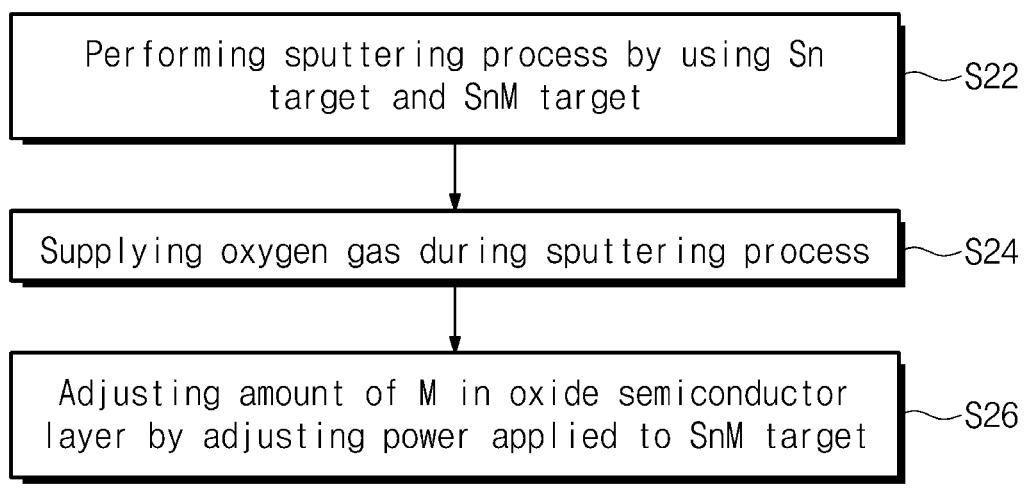
FIG. 8 is a flowchart for specifically illustrating step S20 in FIG. 7.

FIG. 7 is a flowchart showing a method for fabricating a thin film transistor according to some embodiments of the inventive concept and FIG. 8 is a flowchart for specifically describing step S20 in FIG. 7.

Referring to FIGS. 1 and 7, the gate electrode 110 may be formed on the substrate 100 (step S10), and then, the gate dielectric layer 120 covering the gate electrode 110 may be formed. Thereafter, the channel layer 130 may be formed on the gate dielectric layer 120. Forming the channel layer 130 may include forming an oxide semiconductor layer including SnMO on the substrate 100 (step S20). M may include at least one of a non-metal chalcogen element or a halogen element, and for example, may include at least one of selenium (Se), sulfur (S), fluorine (F), chlorine (Cl), bromine (Br), or iodine (I).

Referring to FIGS. 7 and 8, the step S20 for forming an oxide semiconductor layer may include: performing a sputtering process by using an Sn metal target and an SnM compound target (step S22); and supplying an oxygen gas during the sputtering process (step S24). According to some embodiments, an inert gas may be further supplied during the sputtering process. The step S20 for forming an oxide semiconductor layer may further include adjusting an amount of M in the oxide semiconductor layer by adjusting power applied to the SnM compound target during the sputtering process (step S26). The channel layer 130 may be formed to exhibit required surface roughness, hole mobility ($m_{hall}$), and hole carrier density ($n_h$) by adjusting the amount of M in the oxide semiconductor layer.

Referring to FIG. 7 again, forming the channel layer 130 may further include heat-treating the oxide semiconductor layer (step S30). The heat-treatment may be performed in a vacuum atmosphere and may prevent M in the oxide semiconductor layer from being volatilized or substituted with oxygen. The source electrode 140 and the drain electrode 150 may be formed on the channel layer 130 (step S40), and accordingly, the thin film transistor 500 in FIG. 1 may be formed.

Forming the thin film transistor 500 in FIG. 6 may sequentially include: forming the source electrode 140 and the drain electrode 150 on the substrate 100; forming the channel layer 130 covering the source electrode 140 and the drain electrode 150; and forming the gate dielectric layer 120 and the gate electrode 110 on the channel layer 130. The method for fabricating the thin film transistor 500 in FIG. 6 may be substantially the same as the method for fabricating the thin film transistor 500 described with reference to FIGS. 1, 7, and 8, except for the described order difference.

According to the inventive concept, the channel layer 130 in the thin film transistor 500 may include a tin-based oxide represented by SnMO, wherein M may contain or include at least one of a non-metal chalcogen element or a halogen element. The tin-based oxide of SnMO may have a more extended valence band than a tin oxide (SnO), thereby reducing a hole effective mass. As a result, hole mobility ($m_{hall}$) and hole carrier density ($n_h$) in the channel layer 130 may be increased, thereby improving electrical performances of the thin film transistor 500.

Furthermore, the tin-based oxide of SnMO may include an amorphous phase, thereby reducing surface roughness of the channel layer 130.

According to the inventive concept, electrical performances of a thin film transistor may be improved and surface roughness of a channel layer in the thin film transistor may be reduced.

The above description of embodiments of the inventive concept provides illustrative examples for the description of the inventive concept. Therefore, the inventive concept is not limited to the above embodiments, and it will be apparent to those skilled in the art that various modifications and variations can be made in the inventive concept without departing from the spirit and scope of the invention as defined by the appended claims.

What is claimed is:

1. A thin film transistor comprising:
a source electrode;
a drain electrode; and
a channel layer connecting the source electrode and the drain electrode,
wherein the channel layer includes a tin-based oxide represented by $SnM_xO_{1-x}$, where x is larger than 0.2 and smaller than 0.8, and
wherein M includes at least one of selenium (Se), sulfur (S), fluorine (F), chlorine (Cl), bromine (Br), or iodine (I).

2. The thin film transistor of claim 1,
wherein the channel layer includes the tin-based oxide represented by $SnM_xO_{1-x}$,
where x is larger than 0.4 and smaller than 0.7.

3. The thin film transistor of claim 1, wherein the tin-based oxide includes an amorphous phase.

4. The thin film transistor of claim 1, wherein the channel layer further includes a metal element for adjusting a band gap energy of the tin-based oxide.

5. The thin film transistor of claim 4, wherein the metal element includes at least one of lanthanum (La), calcium (Ca), strontium (Sr), yttrium (Y), tantalum (Ta), hafnium (Hf), titanium (Ti), barium (Ba), or zirconium (Zr).

6. The thin film transistor of claim 1, wherein the channel layer further includes a P-type impurity.

7. The thin film transistor of claim 6, wherein the P-type impurity includes at least one of nitrogen (N), phosphorus (P), or arsenic (As).

8. The thin film transistor of claim 1, further comprising:
a gate electrode; and
a gate dielectric layer between the channel layer and the gate electrode.

9. A thin film transistor comprising:
a source electrode;
a drain electrode; and
a P-type oxide semiconductor layer connecting the source electrode and the drain electrode,
wherein the P-type oxide semiconductor layer includes $SnM_xO_{1-x}$, where x is larger than 0.2 and smaller than 0.8, and
wherein M includes at least one of selenium (Se), sulfur (S), fluorine (F), chlorine (Cl), bromine (Br), or iodine (I).

10. The thin film transistor of claim 9, wherein at least a portion of the P-type oxide semiconductor layer is amorphous.

11. The thin film transistor of claim 9, wherein the P-type oxide semiconductor layer comprises SnSeO which includes an amorphous phase.

12. The thin film transistor of claim 11,
wherein the P-type oxide semiconductor layer includes $SnSe_xO_{1-x}$,
where x is larger than 0.2 and smaller than 0.8.

13. The thin film transistor of claim 11,
wherein the P-type oxide semiconductor layer includes $SnSe_xO_{1-x}$,
where x is larger than 0.4 and smaller than 0.7.

14. The thin film transistor of claim 9, wherein the P-type oxide semiconductor layer further includes a metal element.

15. The thin film transistor of claim 9, wherein the P-type oxide semiconductor layer further includes a P-type impurity.

16. The thin film transistor of claim 9, further comprising:
a gate electrode; and
a gate dielectric layer between the P-type oxide semiconductor layer and the gate electrode.

* * * * *